(12) United States Patent
Nimmakayala et al.

(10) Patent No.: US 7,837,907 B2
(45) Date of Patent: Nov. 23, 2010

(54) ALIGNMENT SYSTEM AND METHOD FOR A SUBSTRATE IN A NANO-IMPRINT PROCESS

(75) Inventors: Pawan Kumar Nimmakayala, Austin, TX (US); Byung-Jin Choi, Austin, TX (US)

(73) Assignee: Molecular Imprints, Inc., Austin, TX (US)

( * ) Notice: Subject to any disclaimer, the term of this patent is extended or adjusted under 35 U.S.C. 154(b) by 0 days.

(21) Appl. No.: 12/175,258

(22) Filed: Jul. 17, 2008

(65) Prior Publication Data

US 2009/0026657 A1   Jan. 29, 2009

Related U.S. Application Data

(60) Provisional application No. 60/951,002, filed on Jul. 20, 2007.

(51) Int. Cl.
 *G01B 11/26* (2006.01)
(52) U.S. Cl. .................. 264/39; 264/40.1; 264/40.5; 264/406
(58) Field of Classification Search ........... 264/40.1, 264/40.5, 406, 39, 220
 See application file for complete search history.

(56) References Cited

U.S. PATENT DOCUMENTS

| | | | | |
|---|---|---|---|---|
| 4,024,944 A * | 5/1977 | Adams et al. | ............... | 198/394 |
| 4,251,160 A * | 2/1981 | Bouwhuis et al. | ........... | 356/401 |
| 4,778,275 A * | 10/1988 | van den Brink et al. | ..... | 356/401 |
| 5,721,607 A * | 2/1998 | Ota | ............... | 355/53 |
| 6,417,922 B1 * | 7/2002 | Dirksen et al. | ............... | 356/401 |
| 6,462,818 B1 * | 10/2002 | Bareket | ............... | 356/401 |
| 6,486,954 B1 * | 11/2002 | Mieher et al. | ............... | 356/401 |
| 6,580,505 B1 * | 6/2003 | Bareket | ............... | 356/401 |
| 6,696,220 B2 | 2/2004 | Bailey et al. | | |
| 6,842,229 B2 | 1/2005 | Sreenivasan et al. | | |
| 6,873,087 B1 | 3/2005 | Choi et al. | | |
| 6,876,436 B2 * | 4/2005 | Burghoorn | ............... | 355/67 |
| 6,894,261 B2 * | 5/2005 | Castenmiller et al. | .... | 250/208.1 |
| 6,894,783 B2 * | 5/2005 | Bareket | ............... | 356/401 |
| 6,902,853 B2 | 6/2005 | Sreenivasan et al. | | |
| 6,916,584 B2 | 7/2005 | Sreenivasan et al. | | |
| 6,919,152 B2 * | 7/2005 | Sreenivasan et al. | .......... | 430/30 |
| 6,921,615 B2 | 7/2005 | Sreenivasan et al. | | |
| 6,922,906 B2 | 8/2005 | Choi et al. | | |
| 6,929,762 B2 * | 8/2005 | Rubin | ............... | 264/40.1 |
| 6,932,934 B2 | 8/2005 | Choi et al. | | |
| 6,936,194 B2 | 8/2005 | Watts | | |

(Continued)

*Primary Examiner*—Joseph S Del Sole
*Assistant Examiner*—Timothy Kennedy
(74) *Attorney, Agent, or Firm*—Laura C. Robinson

(57) ABSTRACT

A transparent imprint template mold is configured with gratings surrounding the active imprint area. The gratings are fabricated at the same time as the active area and thus accurately define the active area with respect to the gratings. The substrate is positioned in tool coordinates under the template mold. A sensor system generates a beam of optical energy and receives reflected energy only at a specific angular window and is used to locate the template mold. The sensor system is scanned to locate the substrate and the gratings in tool coordinates. In this manner, the relative position of the template mold is determined with respect to the substrate in tool coordinates. The substrate is then accurately positioned with respect to the template mold. The system may be used to track imprinted pattern position relative to the substrate and to determine concentricity of patterns to substrates.

13 Claims, 7 Drawing Sheets

U.S. PATENT DOCUMENTS

| | | | |
|---|---|---|---|
| 6,951,173 B1 | 10/2005 | Meissl et al. | |
| 6,954,275 B2 | 10/2005 | Choi et al. | |
| 6,955,868 B2 | 10/2005 | Choi et al. | |
| 6,986,975 B2 | 1/2006 | Sreenivasan et al. | |
| 7,027,156 B2 | 4/2006 | Watts et al. | |
| 7,060,402 B2 | 6/2006 | Choi et al. | |
| 7,070,405 B2 | 7/2006 | Sreenivasan et al. | |
| 7,077,992 B2 | 7/2006 | Sreenivasan et al. | |
| 7,095,499 B2 * | 8/2006 | Monshouwer et al. | 356/401 |
| 7,098,572 B2 | 8/2006 | Choi et al. | |
| 7,102,749 B2 * | 9/2006 | Bareket | 356/401 |
| 7,109,508 B2 * | 9/2006 | Shiraishi | 250/559.29 |
| 7,136,150 B2 | 11/2006 | Sreenivasan et al. | |
| 7,150,622 B2 | 12/2006 | Choi et al. | |
| 7,170,589 B2 | 1/2007 | Cherala et al. | |
| 7,179,396 B2 | 2/2007 | Sreenivasan | |
| 7,186,483 B2 | 3/2007 | Sreenivasan et al. | |
| 7,281,921 B2 | 10/2007 | Watts et al. | |
| 7,292,326 B2 | 11/2007 | Nimmakayala et al. | |
| 7,303,383 B1 | 12/2007 | Sreenivasan et al. | |
| 7,323,130 B2 | 1/2008 | Nimmakayala et al. | |
| 7,396,475 B2 | 7/2008 | Sreenivasan | |
| 2002/0150398 A1 | 10/2002 | Choi et al. | |
| 2004/0021254 A1 * | 2/2004 | Sreenivasan et al. | 264/406 |
| 2004/0065252 A1 | 4/2004 | Sreenivasan et al. | |
| 2004/0065976 A1 | 4/2004 | Sreenivasan et al. | |
| 2004/0141163 A1 | 7/2004 | Bailey et al. | |
| 2004/0141168 A1 * | 7/2004 | Sreenivasan et al. | 355/75 |
| 2004/0149687 A1 | 8/2004 | Choi et al. | |
| 2004/0163563 A1 | 8/2004 | Sreenivasan et al. | |
| 2005/0064344 A1 | 3/2005 | Bailey et al. | |
| 2005/0116370 A1 * | 6/2005 | Ogino et al. | 264/40.1 |
| 2005/0260295 A1 | 11/2005 | Choi et al. | |
| 2005/0264132 A1 | 12/2005 | Choi et al. | |
| 2005/0269745 A1 | 12/2005 | Cherala et al. | |
| 2005/0270516 A1 | 12/2005 | Cherala et al. | |
| 2005/0271955 A1 | 12/2005 | Cherala et al. | |
| 2005/0274219 A1 | 12/2005 | Choi et al. | |
| 2005/0275251 A1 | 12/2005 | Choi et al. | |
| 2005/0275311 A1 | 12/2005 | Choi et al. | |
| 2006/0005657 A1 | 1/2006 | Choi et al. | |
| 2006/0114450 A1 | 6/2006 | Nimmakayala et al. | |
| 2006/0115999 A1 | 6/2006 | Sreenivasan et al. | |
| 2006/0172229 A1 * | 8/2006 | Choi et al. | 430/311 |
| 2006/0285095 A1 * | 12/2006 | Van Buel et al. | 355/53 |
| 2007/0002298 A1 * | 1/2007 | Visser | 355/55 |
| 2007/0019177 A1 * | 1/2007 | Wilhelmus Maria Van Buel et al. | 355/55 |
| 2007/0132152 A1 | 6/2007 | Choi et al. | |
| 2007/0170617 A1 | 7/2007 | Choi et al. | |
| 2007/0228609 A1 | 10/2007 | Sreenivasan et al. | |
| 2007/0228610 A1 | 10/2007 | Sreenivasan et al. | |
| 2007/0231421 A1 | 10/2007 | Nimmakayala et al. | |
| 2007/0243655 A1 | 10/2007 | Schmid et al. | |
| 2007/0287081 A1 | 12/2007 | Cherala et al. | |
| 2008/0153312 A1 | 6/2008 | Sreenivasan et al. | |
| 2009/0025246 A1 | 1/2009 | Choi et al. | |

* cited by examiner

ALIGNMENT SYSTEM AND METHOD FOR A SUBSTRATE IN A NANO-IMPRINT PROCESS

TECHNICAL FIELD

The field of the invention relates generally to nano-fabrication of structures.

BACKGROUND INFORMATION

Nano-fabrication involves the fabrication of very small structures, e.g., having features on the order of nanometers or smaller. One area in which nano-fabrication has had a sizeable impact is in the processing of integrated circuits. As the semiconductor processing industry continues to strive for larger production yields while increasing the circuits per unit area formed on a substrate, nano-fabrication becomes increasingly important. Nano-fabrication provides greater process control while allowing increased reduction of the minimum feature dimension of the structures formed. Other areas of development in which nano-fabrication has been employed include biotechnology, optical technology, mechanical systems and the like.

An exemplary nano-fabrication technique is commonly referred to as imprint lithography. Exemplary imprint lithography processes are described in detail in numerous publications, such as United States patent application publication 2004/0065976 filed as U.S. patent application Ser. No. 10/264,960, entitled "Method and a Mold to Arrange Features on a Substrate to Replicate Features having Minimal Dimensional Variability"; United States patent application publication 2004/0065252 filed as U.S. patent application Ser. No. 10/264,926, entitled "Method of Forming a Layer on a Substrate to Facilitate Fabrication of Metrology Standards"; and U.S. Pat. No. 6,936,194, entitled "Functional Patterning Material for Imprint Lithography Processes," all of which are assigned to the assignee of the present invention, and incorporated by reference herein.

The imprint lithography technique disclosed in each of the aforementioned United States patent application publications and United States patent includes formation of a relief pattern in a polymerizable layer and transferring a pattern corresponding to the relief pattern into an underlying substrate. The substrate may be positioned upon a motion stage to obtain a desired position to facilitate patterning thereof. To that end, a template is employed spaced-apart from the substrate with a formable liquid present between the template and the substrate. The liquid is solidified to form a solidified layer that has a pattern recorded therein that is conforming to a shape of the surface of the template in contact with the liquid. The template is then separated from the solidified layer such that the template and the substrate are spaced-apart. The substrate and the solidified layer are then subjected to processes to transfer, into the substrate, a relief image that corresponds to the pattern in the solidified layer.

SUMMARY

A system for aligning a transparent imprint template mold to a substrate comprising a scanning sensor system that generates a beam of optical energy and is configured to receive only portions of the optical energy reflected from detection surfaces that occur within an angular window relative to a surface of the substrate. The gratings are disposed surrounding an active area corresponding to the imprint template. The gratings have detection surfaces that have a pitch that corresponds to a predetermined dimensional increment so that position can be determined. The system further comprising a tool positioning system for positioning the substrate under the transparent template mold determined by tool coordinates. The system has a positioning stage disposed between the sensor system and the substrate that is configured to position an active area of the imprint template mold relative to a surface of the substrate.

The system has a controller for generating the control signals that operate to position the substrate and the sensor system. The sensor signals respond to variations in received optical energy either reflected or scattered from either the template or substrate.

First, a method to locate and orient the template in the stage coordinate frame is disclosed. Templates have an active area with imprintable features. Gratings on the template are generated at the same time as imprint features and thus are accurately located with respect to the imprinting features. Gratings may be made of continuous lines or multi-segmented lines. The sensor system generates a beam of optical energy and is configured to receive only portions of the optical energy within a small angular window relative to the surface of the measuring surface. The sensor signals are processed in a controller to locate the template in the tool coordinates.

In another embodiment, the same optical sensor may locate the edge of substrate when the measuring optical beam is reflected via a reflecting surface that is inclined to direct the reflecting beam to reach the receiver of the sensor. When the edge of the substrate blocks the returning beam, the optical energy at the receiver changes, which tells the location of the substrate edge. Both the center location of the substrate and diameter of the substrate ID may be determined.

In another embodiment, a similar system/method to locate/orient the imprinted substrate in the stage coordinate frame is disclosed. Substrates contain gratings after imprint with templates with matching gratings. Gratings on the substrate have identical pitch corresponding to that of the template. The same sensor for the template may be used to locate/orient the substrate by collecting the optical energy from the substrate gratings. By measuring the locations and orientations of the imprinted grating on the substrate, errors of the grating with respect to the substrate can be used to compensate for centering and orientation errors for subsequent imprinting. Compensation for the centering error may be adjusted so that imprinted features on the substrate can be biased to a predetermined direction.

DETAILED DESCRIPTION

Figure 1:
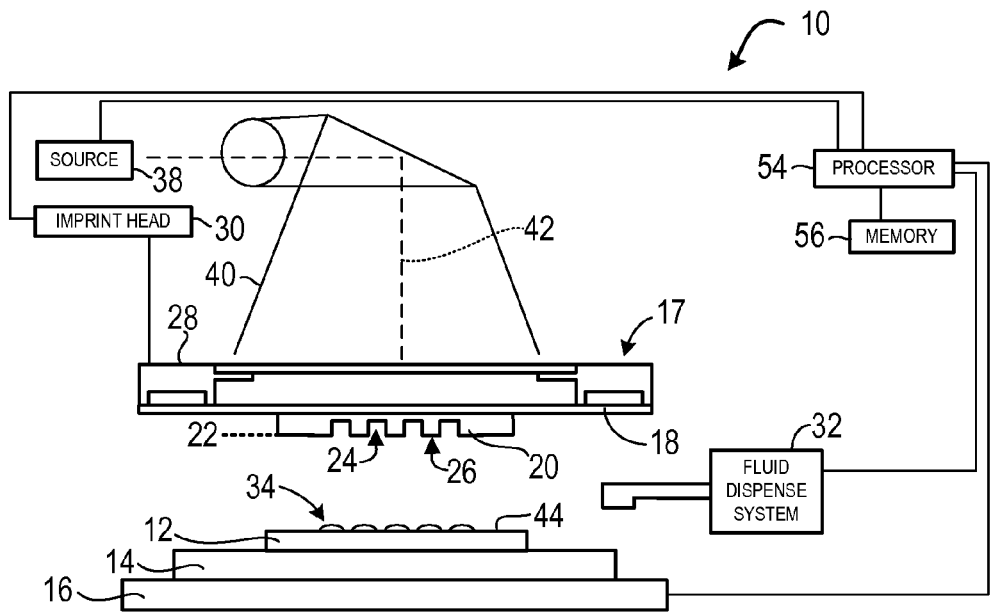
FIG. 1 is a simplified side view of a lithographic system having a mold spaced-apart from a substrate.

FIG. 1 shows a system 10 configured to form a relief pattern on a substrate 12. Substrate 12 may be coupled to a substrate chuck 14. As shown, substrate chuck 14 is a vacuum chuck, however, substrate chuck 14 may be any chuck including, but not limited to, vacuum, pin-type, groove-type, or electromagnetic chuck, as described in U.S. Pat. No. 6,873,087 entitled "High-Precision Orientation Alignment and Gap Control Stages for Imprint Lithography Processes," which is incorporated herein by reference. Substrate 12 and substrate chuck 14 may be supported upon a stage 16. Further, stage 16, substrate 12, and substrate chuck 14 may be positioned on a base (not shown). Stage 16 may provide motion about the X and Y axes.

Spaced-apart from substrate 12 is a patterning device 17. Patterning device 17 comprises a template 18 having a mesa 20 extending therefrom towards substrate 12 with a patterning surface 22 thereon. Further, mesa 20 may be referred to as a mold 20. Mesa 20 may also be referred to as a nano-imprint mold 20. In a further embodiment, template 18 may be substantially absent of mold 20. Template 18 and/or mold 20 may be formed from such materials including, but not limited to, fused-silica, quartz, silicon, organic polymers, siloxane polymers, borosilicate glass, fluorocarbon polymers, metal, and hardened sapphire. As shown, patterning surface 22 comprises features defined by a plurality of spaced-apart recesses 24 and protrusions 26. However, in a further embodiment, patterning surface 22 may be substantially smooth and/or planar. Patterning surface 22 may define an original pattern that forms the basis of a pattern to be formed on substrate 12. Template 18 may be coupled to a template chuck 28 selected from a set of chucks including but not limited to vacuum, pin-type, groove-type, or electromagnetic chucks, as described in U.S. Pat. No. 6,873,087 entitled "High-Precision Orientation Alignment and Gap Control Stages for Imprint Lithography Processes." Further, template chuck 28 may be coupled to an imprint head 30 to facilitate movement of template 18, and therefore, mold 20. In the following detailed description, the template 18 and mold or mesa 20 may be referred to as a template mold to simply descriptions.

System 10 further comprises a fluid dispense system 32. Fluid dispense system 32 is configured to deposit polymeric material 34 on substrate 12. System 10 may include any number of fluid dispensers and fluid dispense system 32 may itself comprise a plurality of dispensing units. Polymeric material 34 may be positioned upon substrate 12 using any known technique, e.g., drop dispense, spin-coating, dip coating, chemical vapor deposition (CVD), physical vapor deposition (PVD), thin film deposition, thick film deposition, and the like. Typically, polymeric material 34 is disposed upon substrate 12 before mold 20 is moved into a predetermined proximity of substrate 12 thereby establishing a desired volume between mold 20 and substrate 12. However, the amount of polymeric material 34 may be sized so the desired volume is filled when mold 20 is positioned to the desired proximity of substrate 20.

Figure 2:
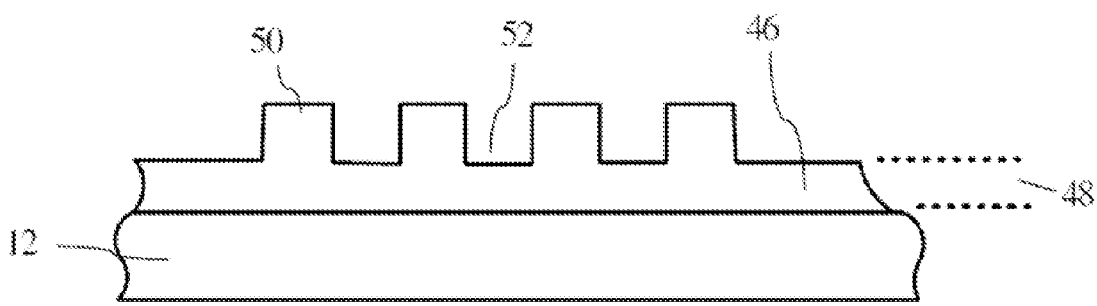
FIG. 2 is a side view of the substrate shown in FIG. 1, having a patterned layer thereon.

Referring to FIG. 1 and FIG. 2 system 10 further comprises a source 38 of energy 40 coupled to direct energy 40 along a path 42. Imprint head 30 and stage 16 are configured to superimpose mold 20 and substrate 12 and dispose them in path 42. Either imprint head 30, stage 16, or both vary a distance between mold 20 and substrate 12 to define a desired volume therebetween that may be filled by polymeric material 34. After the desired volume is filled with polymeric material 34, source 38 produces the energy 40 (e.g., broadband ultraviolet radiation) to cause polymeric material 34 to solidify and/or cross-link thus forming to the shape of a surface 44 of substrate 12, patterning surface 22, and defining a patterned layer 46 on substrate 12.

Patterned layer 46 may comprise a residual layer 48 and a plurality of features shown as protrusions 50 and recessions 52. System 10 may be regulated by a processor 54 that is in data communication with stage 16, imprint head 30, fluid dispense system 32, and source 38, wherein the processor 54 operates on a computer readable program stored in memory 56.

The system described above may be further employed in imprint lithography processes and systems referred to in U.S. Pat. No. 6,932,934, entitled "Formation of Discontinuous Films During an Imprint Lithography Process"; U.S. Pat. No. 7,077,992, entitled "Step and Repeat Imprint Lithography Processes"; and U.S. Pat. No. 7,179,396, entitled "Positive Tone Bi-Layer Imprint Lithography Method"; and U.S. Pat. No. 7,396,475, entitled "Method of Forming Stepped Structures Employing Imprint Lithography," all of which are incorporated by reference herein. In another embodiment, the above-described system may be employed in any known technique, for example, photolithography (various wavelengths including G line, I line, 248 nm, 193 nm, 157 nm, and 13.2-13.4 nm), contact lithography, e-beam lithography, x-ray lithography, ion-beam lithography and atomic beam lithography.

The present invention facilitates detection of the transparent template mold on the imprint tool, specially for patterned media imprint tools. Typically, a single digit micron of concentricity alignment is desirable for the patterning. This requires a system and method that can determine the relative location, within a few microns, between the template active area and substrate in tool stage coordinates. Meeting this system requirement is further complicated by the poor accuracy in placing the mold 20 with respect to the template 18 edge (i.e., the edges of template 18 cannot be used to determine the position of the template 18 active area). Also, the template 18 is placed with its active area facing the wafer chuck 14 (downward), which restricts placing sensors that can detect mold 20 when coupled to template 18. Hence, a system is desired that can detect the template 18 while viewing its non-active side and determine its position in tool stage coordinates without using the edges of template 18 as a reference. Similarly, for detection of substrate 12, only the edge or chamfer of substrate 12 may be used as a reference.

Another associated problem is detection of the error in centricity alignment of the imprinted pattern to substrate 12. Such a post-imprint measurement provides critical data to update the centering location of the substrate 12. In-line post-imprint measurement needs to be performed in the tool during processing.

Figure 3A:
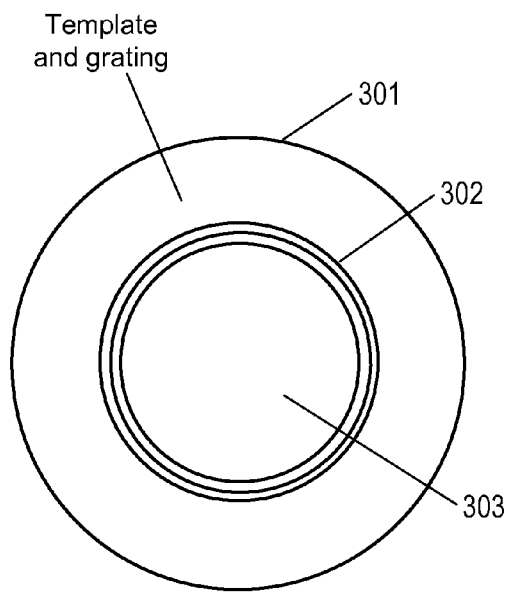
FIG. 3A illustrates a template with an added grating surrounding an active area.
Figure 3B:
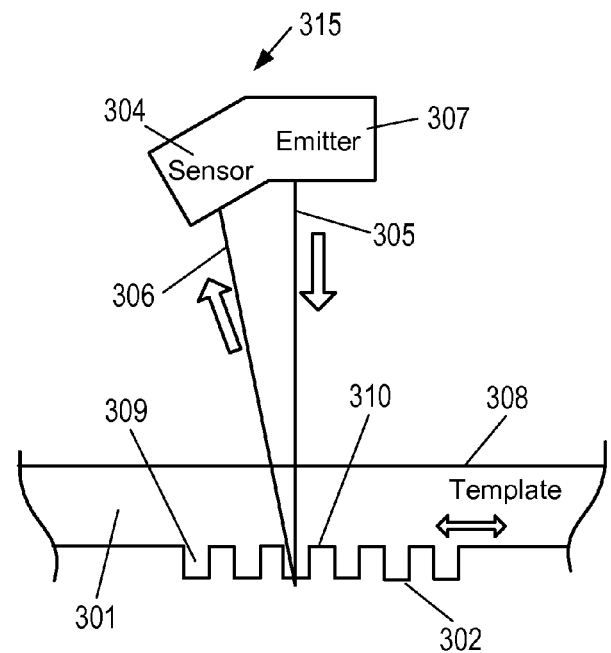
FIG. 3B illustrates a light beam from a sensor system impinging on the back side of a grating on the template of FIG. 3A according to embodiments herein.
Figure 3C:
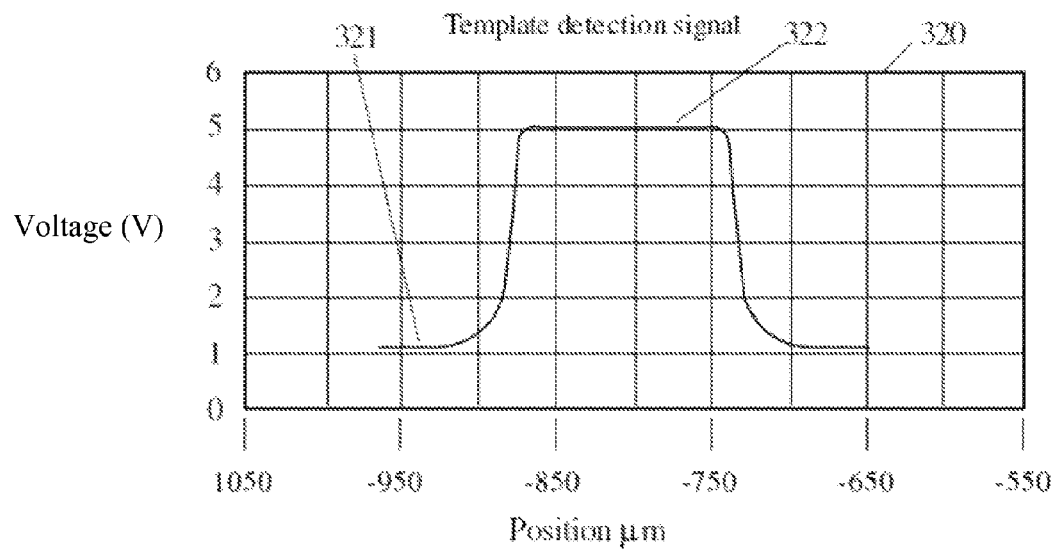
FIG. 3C illustrates an exemplary waveform of the sensor in FIG. 3B.

FIG. 3A is a surface view of a template 301 that has an imprint mold (e.g., mold 20) with an active area 303. In this embodiment, circular gratings 302 are formed around the active area 303. The gratings 302 are formed on the same side as the active area during fabrication of the imprint mold (e.g., mold 20). FIG. 3B is a side view of an emitter 307 and a sensor 304 herein referred as sensor system 315 for simplicity. Emitter 307 and sensor 304 are positioned at angles with respect to a normal to surfaces parallel 30 to surface 308. Light from emitter 307 strikes the transparent template mold and impinges on the backside of gratings 302. Light reflected from the gratings vary as the impinging light moves from the wells 309 of the grating to the peaks 310. The edges of the gratings interfere with the reflected light when the impinging light is in the well 309 and does not interfere when it strikes the peak 310. The gratings 302 are formed with a precise pitch such that electrical signals have voltage transitions at times proportional to a distance parameter. The sensor 304 and emitter 307 are thus positioned so that only reflected light at a certain angle window reaches the sensor 304. FIG. 3C illustrates a voltage waveform 320 having a peak 322 and a valley 321 that is typical of a waveform generated by sensor 304 receiving reflected light 306 when the "teeth" of the grating pass through the light beam 305 of emitter 307. The width of the pulse shown is proportional to the physical width or pitch of the grating "teeth".

Figure 4A:
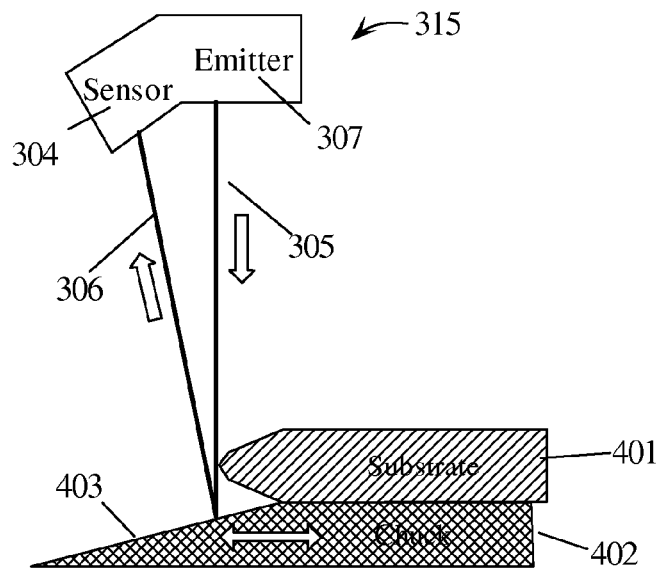
FIG. 4A illustrates the sensor system of FIG. 3B as its light beam crosses a substrate edge and impinges on a chamfered surface of a chuck according to embodiments herein.

FIG. 4A illustrates a side view of emitter 307 and sensor 304 in relation to substrate 401 and chuck 402. In this embodiment, the incident light 305 and reflected light 306 interact with the edge of substrate 401 and chuck 402. Chuck 402 may be configured with a reflective incline or chamfer 403 that insures the reflected light 306 misses sensor 304 when the edge of substrate 401 is passed. In this manner, the edge of substrate 401 may be detected by the sharp drop in reflected light reaching sensor 304.

Figure 4B:
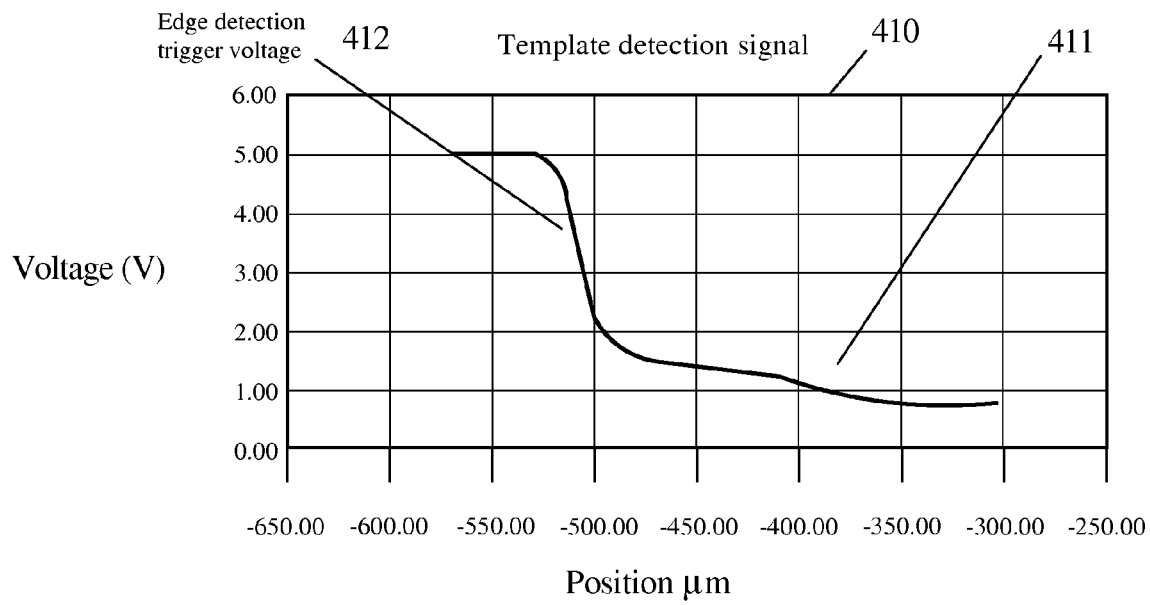
FIG. 4B illustrates an exemplary waveform of the sensor in FIG. 4A as the sensor system scans across the substrate edge.

FIG. 4B illustrates an exemplary waveform 410 generated by the sensor 304 when the sensor system 315 is scanned over the edge of substrate 401 and impinges on chuck 402. Level 412 represents the sensor signal when the light 305 is reflected from substrate 401 and level 411 represents the sensor signal when light 305 impinges on surface 403 of chuck 402.

Figure 5:
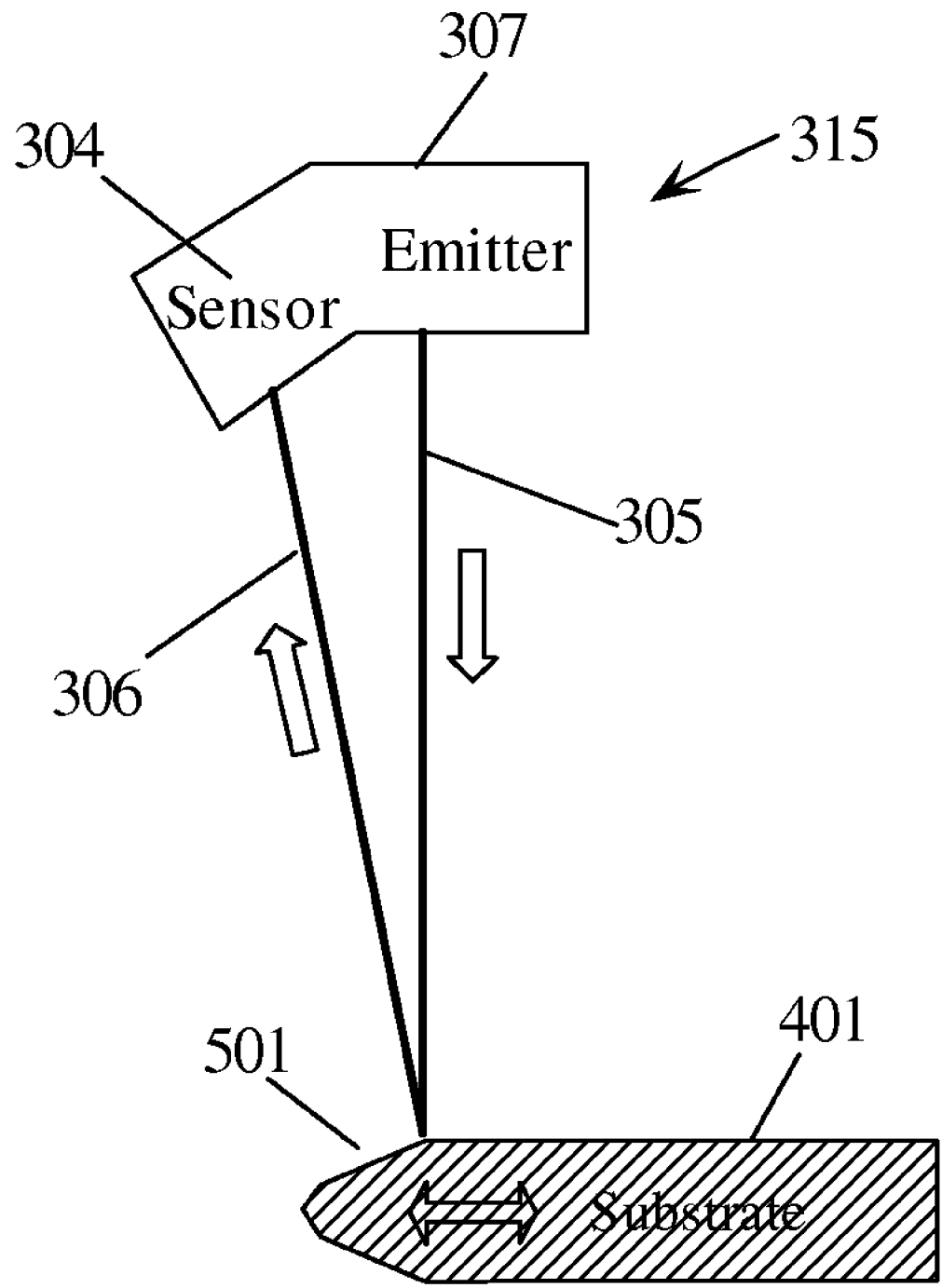
FIG. 5 illustrates the sensor system scanning across the bevel on a substrate edge.

FIG. 5 illustrates an embodiment where the edge of the substrate 401 is configured with a chamfer 501. In this embodiment, there will be a signal change when sensor system 315 is scanned over the edge of substrate 401. The angle of chamfer 501 will cause the incident light 305 to take an altered path 306, which results in less reflected light impinging on sensor 304.

Figure 6A:
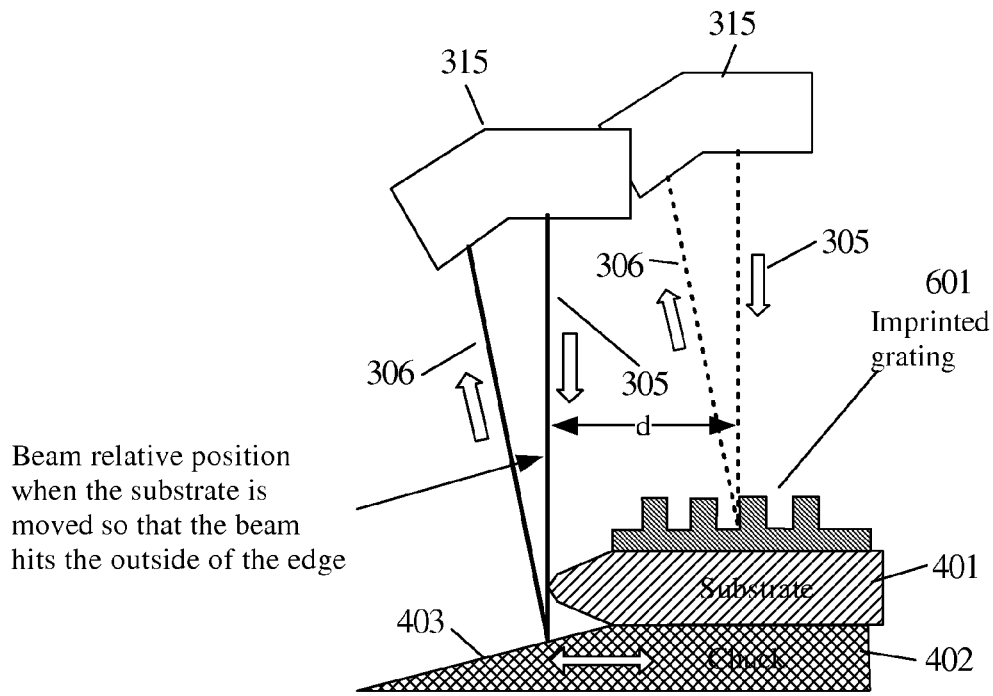
FIG. 6A illustrates scanning the sensor system across the grating imprinted on the substrate and across the substrate edge and chuck chamfer in-situ alignment measurement scheme.

FIG. 6A illustrates an embodiment wherein the grating 302 is imprinted along with an active area as imprinted grating 601. Once the edge of substrate 401 is located, the sensor system 315 may then be scanned until the first "tooth" of grating 301 is located. In this manner, the position of the template 301 relative to an edge of the substrate 401 may be determined. In this case, the location of the imprinted features may be located relative to the edge of the substrate using sensor system 315. Location of the sensor during the measurement of the edge of the substrate and the grating remain not changed.

Figure 6B:
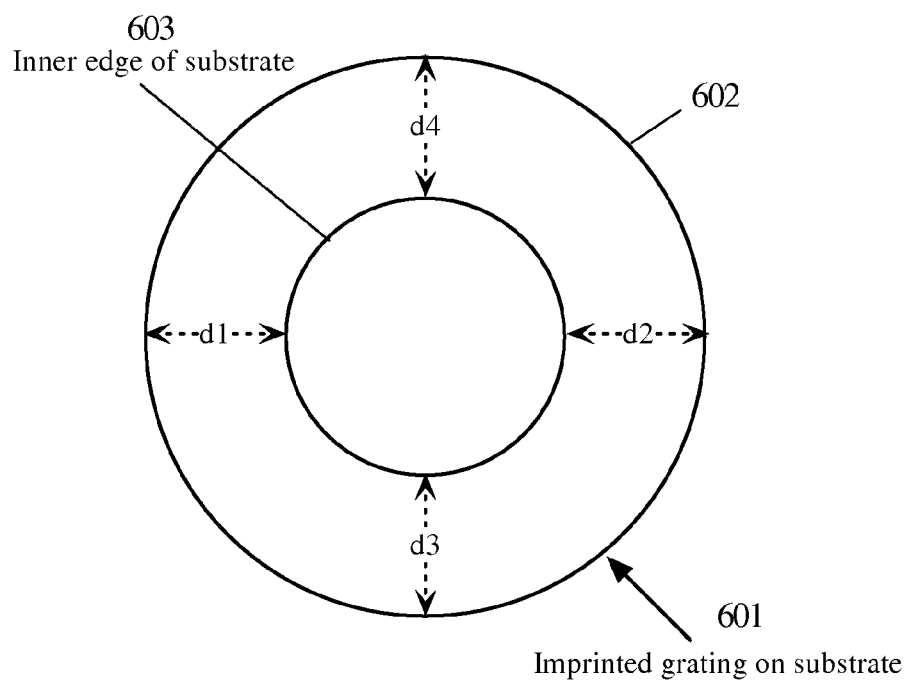
FIG. 6B illustrates measurements suitable for determining relative position of an imprinted pattern on a substrate.

FIG. 6B illustrates a shaped substrate 602 that has an inner edge 603 as well as an outer edge (not shown). The sensor system 315 may be scanned from the inner edge of the substrate across the gratings 601. Similarly, scanning can be made for outer edge of the substrate across the gratings. In this illustration, four measurements (d1-d4) are made, two on each orthogonal axis. In this manner, the imprinted pattern concentricity may be determined for substrate 602.

The present invention solves the problem by providing a means to determine the template 301 and substrate 401 in stage position coordinates. A set of gratings 302 used for template position detection are etched into the template 301 at a pre-defined location during the template fabrication process. Since the set of gratings 302 are fabricated together with the active area, they may be used as references to determine the position of the template 301 active area. These gratings 302 may be rectangular or circular depending on the initial theta (angular) alignment requirement. The gratings 302 have a specific pitch designed based on the wavelength of the incident laser beam (emitter 307) and the incident angle of the laser beam. The size of the gratings 302 is set based on the spot size of the laser beam 307 and the position sensitivity required from the system. The system involves placing a laser emitter 307 and a photo-electric detector 304 above the paths of the template 301 and substrate 401. The photo-electric detector 304 is so placed that it will only receive light 306 reflected at a specific angle. The template 301 is placed onto a loading mechanism and moved by the X-Y stages under the detection sensor. The photo-electric detector 304 is configured to give a null signal when the laser beam 306 is not on the grating 302, however, when the laser 307 is incident on the gratings 302, the first order diffracted light (306) will be incident on the photo-voltaic detector 304 thereby giving an electric signal. This signal may be used to determine the position of the template 301 in the XY stage (e.g., 16 in FIG. 1) or tool coordinates. In the diffraction mode, no intensity of the returning light 306 will be detected on the sensor 304 when the light beam 306 is away from the edges of the substrate 401, however, the edge will direct the returning light 306 to the sensor 304 when the light beam 306 is on the edges of the substrate 401.

In another embodiment, a small inclined surface 403 is provided between the laser emitter 307 and the photo-electric detector 304 on the wafer chuck 402. This reflective surface 403 is inclined by an amount equal to one half the angle between the light source and detector. When the substrate 401 is placed on the chuck 402, the inner edge would overlap the inclined surface 403. In this embodiment, the light beam 305 from the emitter 307 is fully reflected into the detector 304 when the light beam 305 is on the wafer chuck 402. As the scanning beam 305 hits the edge of the substrate 401, the beam 305 is either blocked or directed into a different angle (beam 306) so that no light reaches the photo-electric detector. This sharp drop in signal 410 (slope 412) may be used to detect the edge of the substrate 401.

Sensors for the template 301 and substrate 401 may be the same units, which in turn serves to eliminate the calibration process that is required when two different sets of sensors are used for the template 301 and substrate 401.

When the template grating 302 is imprinted on the substrate 401, the duplicated grating 601 may provide centering information of the template 301 with respect to the substrate 401. The same sensor system 315 may now detect both references: the imprinted grating 601 and the edge of substrate 401.

Figure 7A:
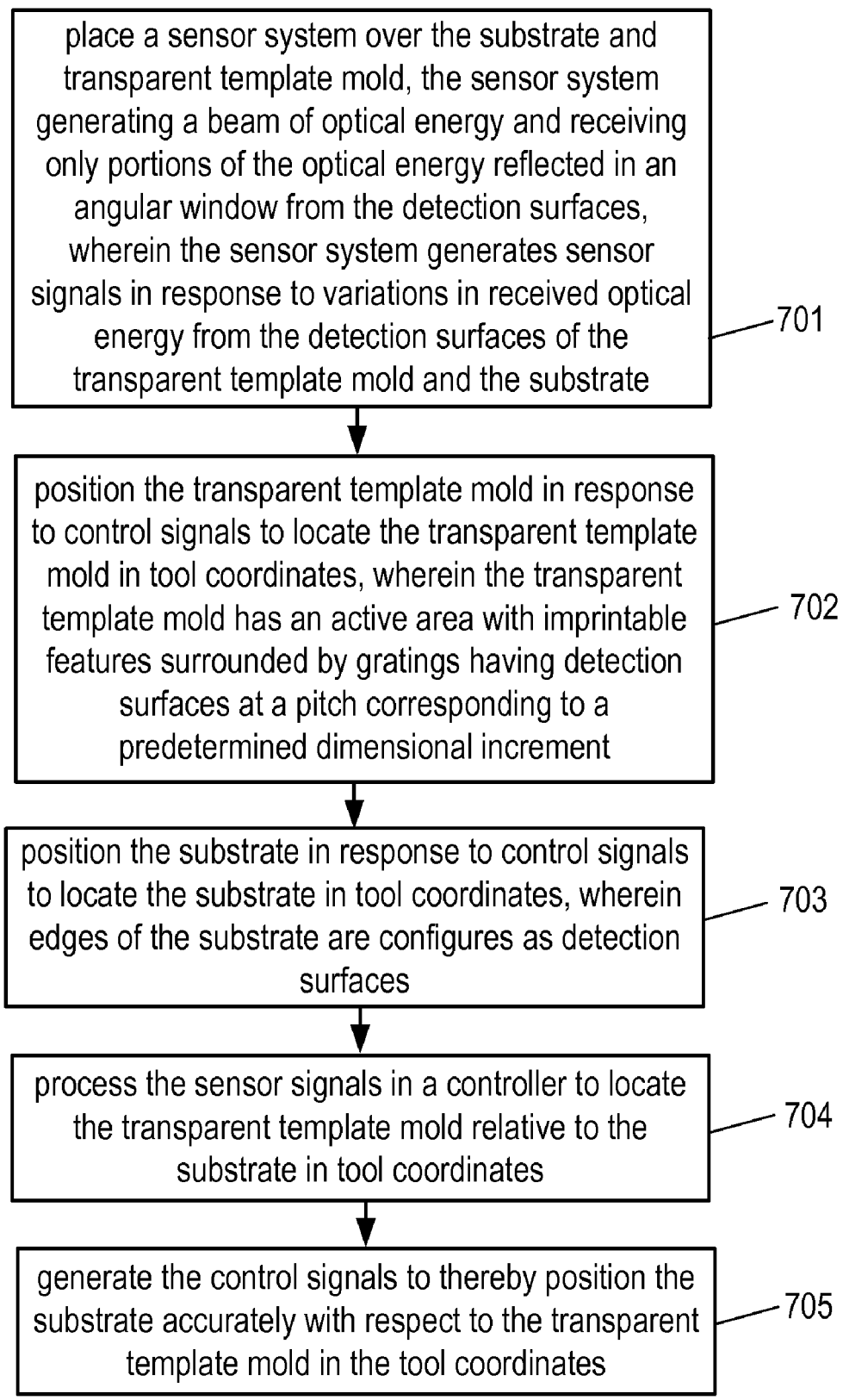
FIG. 7A is a flow chart of method steps used in an embodiment herein.
Figure 7B:
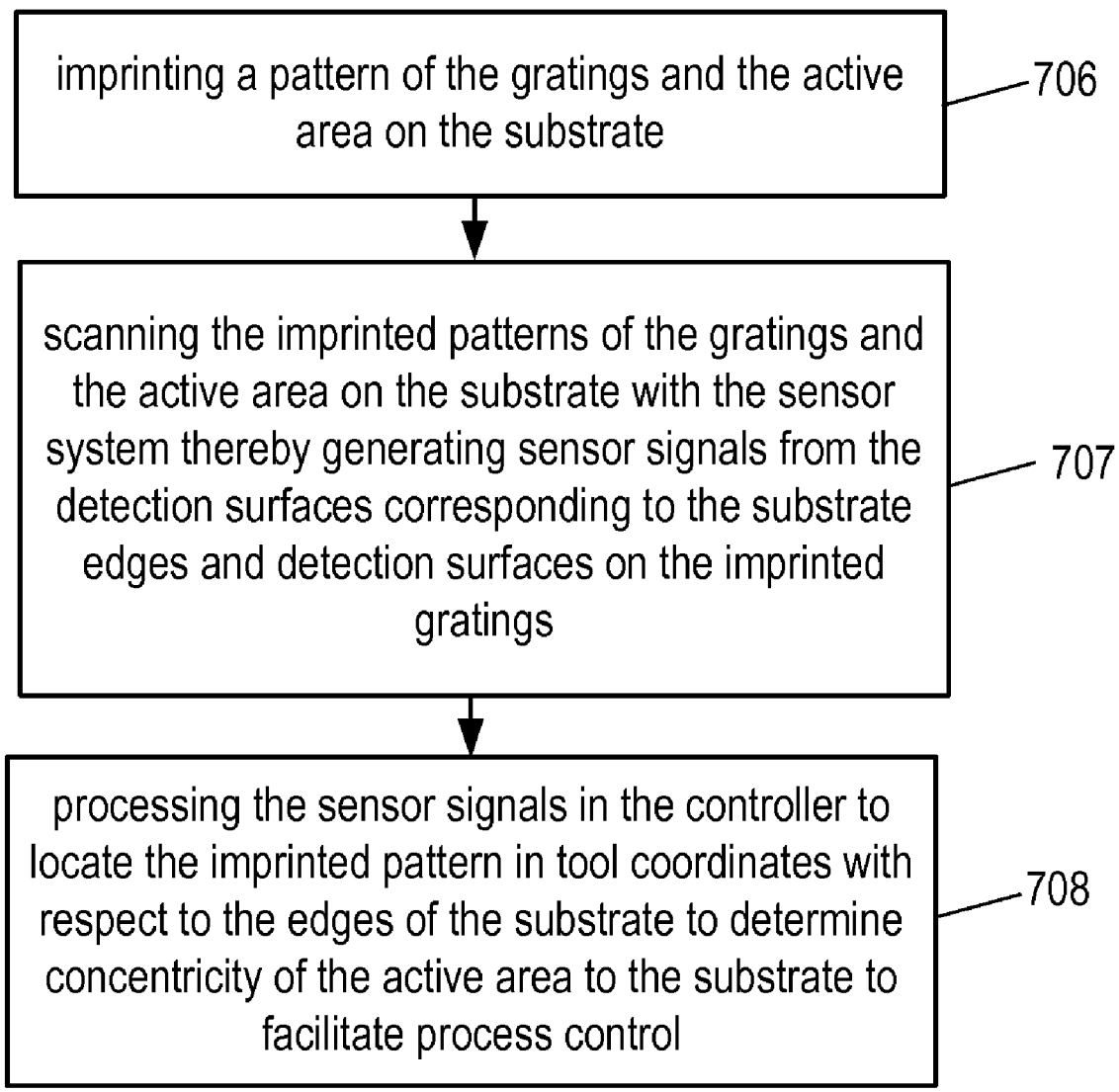
FIG. 7B is a flow chart of additional method steps used in another embodiment herein.

FIGS. 7A and 7B are method steps incorporated in embodiments herein. In step 701, a sensor system is placed over the transparent mold and the substrate. The sensor system generates a beam of optical energy and is configured to receive only portions of the optical energy reflected in an angular window from the detection surfaces. The sensor system also generates sensor signals in response to variations in received optical energy reflected from the detection surfaces of the transparent template mold and the substrate. In step 702, the transparent template mold is positioned in response to control signals to locate the transparent template mold in tool coordinates. The transparent template mold has an active area with imprintable features surrounded by gratings that have detection surfaces at a pitch corresponding to a predetermined dimensional increment. In step 703 the substrate is positioned in response to control signals to locate the substrate in tool coordinates. The substrate has edges that are configured as detection surfaces. In step 704, the sensor signals are processed in a controller to locate the transparent template mold relative to the substrate in tool coordinates. In step 705, the control signals are generated to thereby position the substrate accurately with respect to the transparent template mold in the tool coordinates.

In another embodiment the additional steps are incorporated. In step 706, a pattern of the gratings and the active area are imprinted on the substrate. In step 707, the imprinted patterns of the gratings and the active area on the substrate are scanned by the sensor system thereby generating sensor signals from detection surfaces corresponding to the substrate edges and detection surfaces on the imprinted gratings. In step 708, the sensor signals are processed in the controller to locate the imprinted pattern in tool coordinates with respect to the edges of the substrate to determine concentricity of the active area to the substrate to facilitate process control.

The steps desired in FIGS. 7A-7B may be controlled through processor 54 to operate on system 10 in accordance with embodiments of the present invention. The process steps may be stored as program steps in a computer system stored in memory 56.

The embodiments of the present invention described above are exemplary. Many changes and modifications may be made to the disclosure recited above, while remaining within the scope of the invention. Therefore, the scope of the invention should not be limited by the above description, but instead should be determined with reference to the appended claims along with their full scope of equivalents.

What is claimed is:

1. A method for aligning a template mold to a substrate wherein detection of the substrate uses only edges of the substrate, comprising:
   placing a sensor system over the template mold and the substrate, the sensor system generating a beam of optical energy and configured to receive only portions of the optical energy reflected in an angular window from the detection surfaces, wherein the sensor system generates sensor signals in response to variations in received optical energy reflected from the detection surfaces of the template mold and the substrate;
   positioning the template mold in response to control signals to locate the template mold in tool coordinates, wherein the template mold has an active area with imprintable features surrounded by gratings having detection surfaces at a pitch corresponding to a predetermined dimensional increment;
   positioning the substrate in response to control signals to locate the substrate in tool coordinates, wherein only edges of the substrate are configured as detection surfaces;
   processing the sensor signals in a controller to locate the template mold relative to the substrate in tool coordinates; and
   generating the control signals to thereby position the substrate accurately with respect to the template mold in the tool coordinates
   wherein the substrate is positioned on a chuck, the chuck having a first surface and the edge of the substrate having a second surface such that the first surface directs a beam substantially to the sensor system and the second surface directs a beam substantially away from the sensor system providing variations in received optical energy of the sensor system.

2. The method of claim 1 further comprising:
   imprinting a pattern of the gratings and the active area on the substrate subsequent to positioning the substrate accurately with respect to the template mold in the tool coordinates;
   scanning the imprinted patterns of the gratings and the active area on the substrate with the sensor system thereby generating sensor signals from detection surfaces corresponding to the substrate edges and detection surfaces on the imprinted gratings; and
   processing the sensor signals in the controller to locate the imprinted pattern in tool coordinates with respect to the edges of the substrate to determine concentricity of the active area to the substrate to facilitate process control.

3. The method of claim 1, wherein the gratings are formed as imprint features on the template mold at the same time as imprint features of the active area of the template mold are formed.

4. The method of claim 1, wherein the sensor system comprises a laser light emitter that generates the beam of optical energy and a photo detector, sensitive to a frequency of the laser light, that receives the portions of the optical energy reflected in an angular window from detection surfaces.

5. The method of claim 4, wherein the laser light emitter and photo detector are relatively positioned such that only laser light reflected within a predetermined angular window from a detection surface impinges on the photo detector.

6. The method of claim 1, wherein the gratings are configured as a series of parallel equally spaced rectangular peaks and valleys having a pitch corresponding to a predetermined distance parameter.

7. The method of claim 1, wherein the gratings are imprinted on the substrate at a same time features of the active area are imprinted.

8. The method of claim 7 further comprising:
   scanning the sensor system along orthogonal axes of the substrate with an imprinted pattern and imprinted grid and recording distances to an inner edge to the grating edge; and
   subtracting the distances along each orthogonal path to generate a measure of concentricity of the imprinted pattern to the substrate.

9. The method of claim 1, wherein the first surface of the chuck includes at least one incline.

10. The method of claim 9, wherein the sensor system includes a light source and a detector and the incline of the first surface of the chuck is substantially equal to one half an angle between the light source and the detector.

11. The method of claim 9, wherein the substrate is positioned on the chuck such that an inner edge of the substrate overlaps at least a portion of the incline of the first surface.

12. The method of claim 1, wherein location of the substrate in tool coordinates includes determining a center location of the substrate.

13. The method of claim 1, wherein location of the substrate in tool coordinates includes determining a diameter of the substrate.

* * * * *